United States Patent [19]
Brathwaite et al.

[11] Patent Number: 5,455,386
[45] Date of Patent: Oct. 3, 1995

[54] CHAMFERED ELECTRONIC PACKAGE COMPONENT

[75] Inventors: George A. Brathwaite, Hayward; German J. Ramirez, Antioch; Michael A. Holmes, Ripon; Paul R. Hoffman; Dexin Liang, both of Modesto, all of Calif.

[73] Assignee: Olin Corporation, Manteca, Calif.

[21] Appl. No.: 181,687

[22] Filed: Jan. 14, 1994

[51] Int. Cl.⁶ ................................... H01L 23/02
[52] U.S. Cl. .............................. 174/52.4; 257/710
[58] Field of Search .................... 174/52.1–52.4; 257/678, 684, 688, 704, 710, 722, 730; 361/752

[56] References Cited

U.S. PATENT DOCUMENTS

| | | | |
|---|---|---|---|
| 4,262,165 | 4/1981 | Ohwaki et al. | 174/52.4 |
| 4,703,393 | 10/1987 | Yamamoto et al. | 174/52.4 X |
| 4,989,930 | 2/1991 | Nakagawa et al. | 350/96.2 |
| 5,013,871 | 5/1991 | Mahulikar et al. | 174/52.4 |
| 5,239,131 | 8/1993 | Hoffman et al. | 174/52.4 |
| 5,293,511 | 3/1994 | Poradish et al. | 257/434 |

*Primary Examiner*—Leo P. Picard
*Assistant Examiner*—Christopher Horgan
*Attorney, Agent, or Firm*—Gregory S. Rosenblatt

[57] ABSTRACT

There is disclosed an adhesively sealed electronic package in which a compensation apparatus is provided for excess adhesive. As a result, excess adhesive does not extend beyond the package perimeter, squeeze-out, or travel along the inner lead fingers interfering with wire bonding. The compensation is a chamfer on the peripheral edges and/or interior edges of the package base component and cover component.

17 Claims, 2 Drawing Sheets

CHAMFERED ELECTRONIC PACKAGE COMPONENT

BACKGROUND OF THE INVENTION

This invention relates to semiconductor packages in general. More particularly, the flow of an adhesive sealant is controlled by stamping a chamfer in the peripheral edge of an electronic package component.

Adhesively sealed electronic packages designed to encapsulate one or more semiconductor devices are generally described in U.S. Pat. No. 4,939,316 to Mahulikar et al which is incorporated by reference in its entirety herein. These packages have separate base and cover components which define a central cavity for encasing the semiconductor devices. A leadframe is disposed between the base and the cover and adhesively bonded to both. Small diameter bond wires electrically interconnect semiconductor devices to the inner lead ends of the leadframe. The outer lead ends of the leadframe are electrically interconnected to external circuitry such as a printed circuit board.

The electronic package base and cover components can be formed from any suitable material such as a metal, plastic or ceramic. To maximize the dissipation of heat generated by the semiconductor device during operation, the base and cover components are typically formed from a metal or metal alloy such as aluminum or an aluminum based alloy.

The adhesive used to join the base and cover components to the leadframe is typically a thermosetting epoxy. An epoxy preform (a windowframe shape sheet of epoxy) having an outside peripheral dimension approximately matching the outside peripheral dimension of the package is disposed between the leadframe and the base. A second epoxy preform is disposed between the leadframe and the cover. The assembly is then heated, usually to a temperature of about 180° C. and the epoxy bonds the components together. At the seal temperature, the viscosity of the epoxy is reduced and the epoxy readily flows.

The epoxy flow must be controlled. If the epoxy flows into the central cavity, it can interfere with the bond wires. If the epoxy extends beyond the perimeter of the package, commonly referred to as squeeze-out, the epoxy can interfere with forming (bending) of the outer leads such that the leads will not have the required shape or location. Excessive squeeze out can jam or break the trim and form equipment or can lead to the assembled electronic package failing to fit in a test socket or a shipping tray.

Process adjustments to control squeeze-out, such as rigorous control of the thermal profile of the epoxy cure cycle, thickness of the package components, thickness of the epoxy preform, thickness of the assembled package, location of the package in the oven during epoxy cure and tilting of the oven shelves during epoxy cure have not proven effective to eliminate squeeze-out.

U.S. Pat. No. 4,262,165 to Ohwaki et al. discloses that to prevent a sealing glass from extending beyond the perimeter of an electronic package, the sealing glass is screened so that a narrow peripheral portion of the seal area remains free of the sealing glass. During package sealing, the sealing glass flows into this peripheral portion, but does not extend beyond the package perimeter. This solution is suitable for a sealing glass which has a relatively high viscosity, but is not effective for adhesives having a relatively low viscosity at the seal temperature and relatively uncontrolled flow.

U.S. Pat. No. 5,239,131 by Hoffman et al. and which is incorporated by reference in its entirety herein discloses forming a moat between the central region of an electronic package and the inner leads of the leadframe. Excess adhesive is contained by the moat and does not bridge to the inner leads.

There remains, however, a need for an effective means to control the adhesive squeeze-out in electronic packages.

SUMMARY OF THE INVENTION

Accordingly, it is an object of the invention to provide an electronic package component which reduces adhesive squeeze-out. It is a feature of the invention that the electronic package component has a chamfered perimeter. It is another feature of the invention that the chamfer is formed by stamping and has an effective length of from about 0.13 millimeters to about 0.51 millimeters and an angle relative to a major surface of the package of from about 20° to about 50°. Yet another feature of the invention is that an interior corner of the package component may also be chamfered to minimize adhesive flow along the inner leads of a leadframe.

It is an advantage of the invention that the chamfered perimeter compensates for variations in adhesive thickness, package component thickness, sealing profile variations and other process variables. Therefore, less rigorous control over the process is required enabling the process speed and yield to increase. Yet another feature of the invention is that adhesive squeeze-out is reduced facilitating accurate forming of the leads.

In accordance with the invention, there is provided an electronic package component. The package component is a substrate having opposing, generally parallel, first and second major surfaces separated by sidewalls. The first major surface has a central portion and a peripheral portion. This peripheral portion has a seal region and a stamped angular region. The seal region is generally coplanar with the first and second major surfaces. The stamped angular region extends obliquely from the sidewalls to the seal region. The stamped angular region has an effective length of from about 0.13 millimeters to about 0.51 millimeters and is at an angle relative to the first major surface of from about 20° to about 45°.

The above stated objects, features and advantages will become more apparent from the specification and drawings which follow.

DETAILED DESCRIPTION

Figure 1:
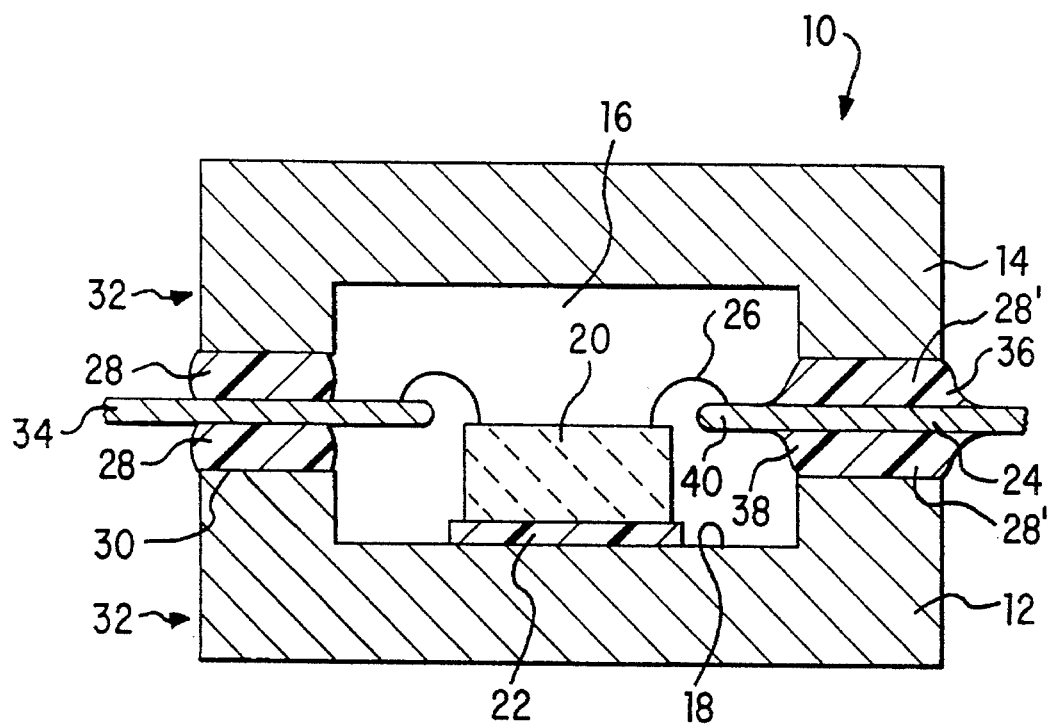
FIG. 1 shows in cross-sectional representation an adhesively sealed electronic package as known from the prior art.

FIG. 1 shows in cross-sectional representation an electronic package 10 as known from the prior art. The electronic package 10 has a base component 12 and a cover component 14. The base component 12 and the cover component 14 can be formed from any suitable material such as a plastic, ceramic, metal, metal alloy, metal composite or metal compound. To maximize thermal conductivity, the base component 12 and cover component 14 are preferably formed from a metal or metal alloy. For reduced weight, aluminum and aluminum alloys are preferred.

It is not necessary for the base component 12 and the cover component 14 to be manufactured from the same material. However, the components should have coefficients of thermal expansion which are approximately equal to prevent distortion of the package due to uneven expansion during heating or cooling.

The base component 12 and the cover component 14 define a centrally positioned cavity 16. Disposed within the cavity 16 and bonded to a central portion 18 of the base component 12 is a semiconductor device 20. A die attach 22, such as a thermosetting epoxy or a low melting point solder, bonds the semiconductor device 20 to the central portion 18 of the base component 12.

A leadframe 24 is disposed between the base component 12 and the cover component 14. Small diameter bond wires 26, formed from gold, aluminum, copper or an alloy thereof, having a diameter on the order of 0.025 millimeters (0.001 inch) electrically interconnect the leadframe 24 to the semiconductor device 20.

An adhesive 28, typically a thermosetting epoxy resin, bonds the leadframe 24 both to the base component 12 and to the cover component 14. In a properly sealed package, the adhesive appears as indicated at reference numeral 28, extending across the entire peripheral portion 30 of the base component 12 and cover component 14. The adhesive 28 terminates at the perimeter 32 of both the base component 12 and cover component 14.

Control of the adhesive 28 is difficult, the hot adhesive has a low viscosity. Squeeze-out 36 occurs when the adhesive 28' extends beyond the perimeter 32 of either the base component 12 or cover component 14. Squeeze-out 36 interferes with proper forming of the outer leads 34. Run-in 38 occurs when the adhesive 28' travels along the inner lead portion 40 of the leadframe 24 and may interfere with bonding of the bond wire 26 to the inner lead portion 40.

Figure 2:
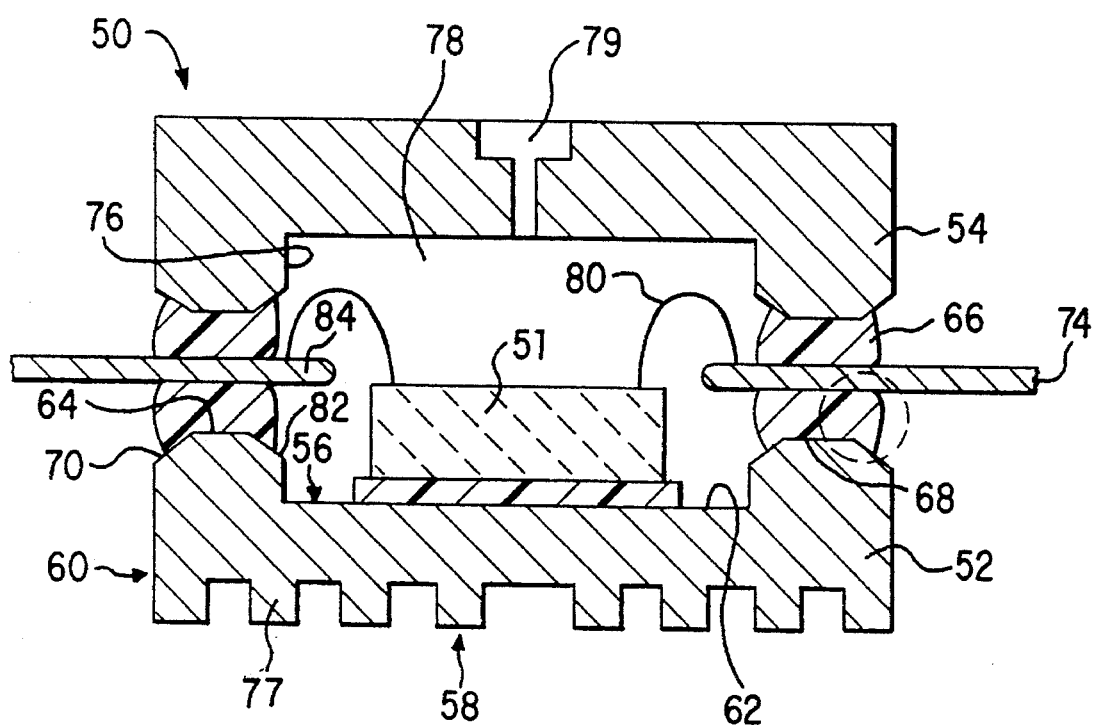
FIG. 2 shows in cross-sectional representation an adhesively sealed electronic package in accordance with the teachings of the invention.

Adhesive flow control is improved in the electronic package 50 shown in cross-sectional representation in FIG. 2. The electronic package 50 has base 52 and cover 54 components, at least one of which includes a chamfer. Both the base component 52 and the cover component 54 are formed from a substrate having opposing, generally parallel, first 56 and second 58 major surfaces. The first major surface 56 and second major surface 58 are separated by sidewalls 60. The first major surface 56 is divided into a central portion 62 and peripheral portion 64. The central portion 62 and peripheral portion 64 may constitute separate regions on a flat, generally planar first major surface or be elevationally separated by a step 76. The peripheral portion 64 of the component is that portion which receives a polymer adhesive 66 while the central portion 62 may receive a semiconductor device 51. Fins 77 may also be formed into the second major surface 58. If the central portion is part of the cover component 54, it may receive a vent hole 79.

Figure 3:
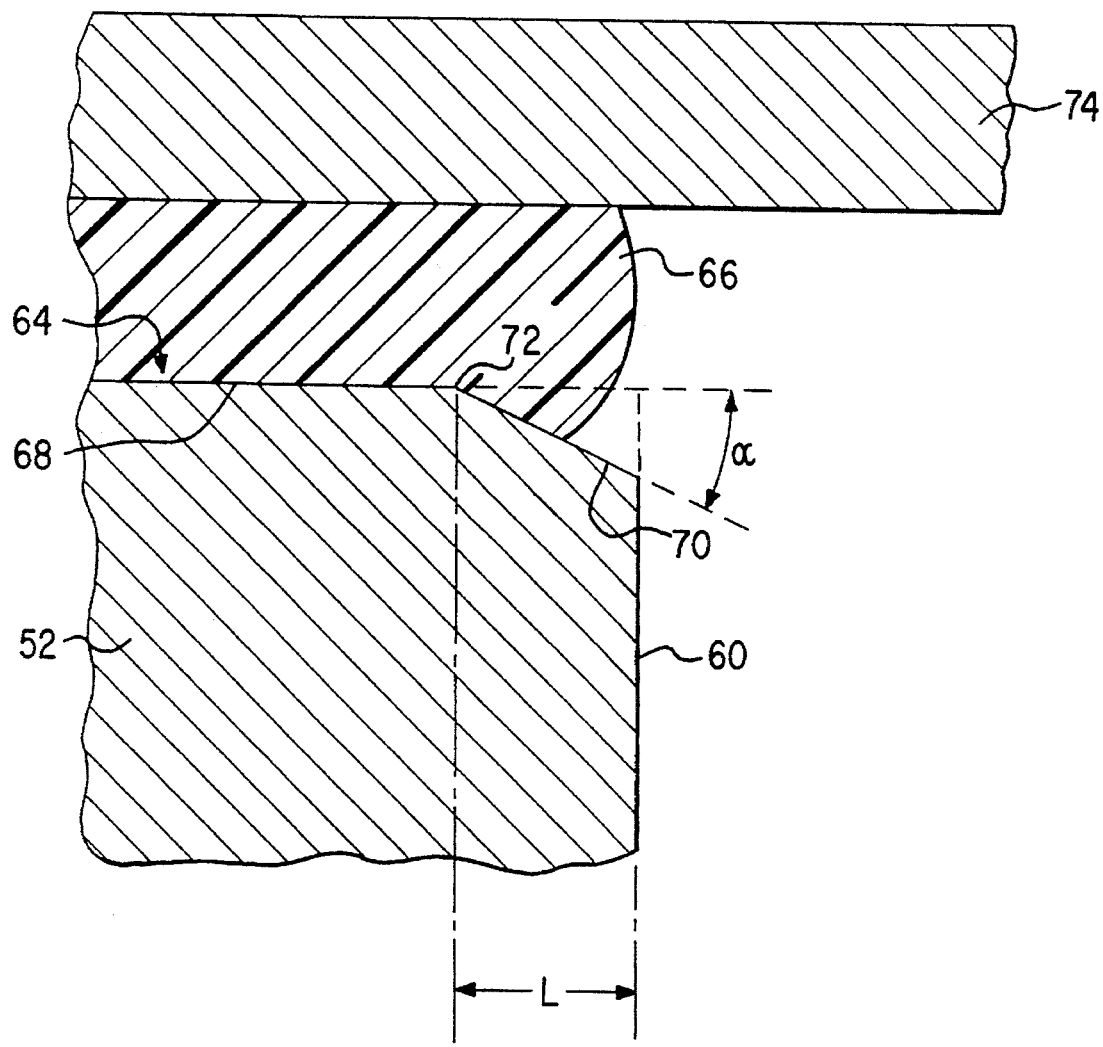
FIG. 3 shows in cross-sectional representation an enlarged view of the peripheral portion of an electronic package component formed in accordance with the teachings of the invention.

The peripheral portion 64 includes a seal region 68 and a stamped angular region 70 as seen more clearly in FIG. 3.

With reference to FIG. 3, the base component 52 has a sidewall 60 and a peripheral portion 64 of a first major surface. The peripheral portion 64 includes a seal region 68 which is generally coplanar with the first and second major surfaces and contacts the adhesive 66. The stamped angular region 70 extends obliquely from the sidewalls 60 to the seal region 68.

The stamped angular region 70 has an effective length, "L", the distance from the sidewall 60 to the inflection point 72, of from about 0.13 millimeters to about 0.51 mm (0.005–0.020 inch). Preferably, the length, L, is from about 0.18 mm to about 0.38 mm (0.007–0.015 inch) and most preferably, from about 0.23 mm to about 0.28 mm (0.009–0.011 inch).

When L is less than about 0.18 mm, the chamfer is ineffective. There is insufficient volume available to contain excess epoxy. Squeeze-out still occurs and poor lead forming results.

When L exceeds about 0.38 mm, the leadframe is supported by the adhesive 66 rather than the seal region 68. The adhesive 66 is softer, even when cured, than the package substrate and the leadframe 74 is inadequately supported. Poor coplanarity between leads or bent or skewed leads result.

The angle, $\alpha$, made by the stamped angular portion 70 relative to the first major surface as defined by the peripheral portion 64 is from about 20° to about 45°. Preferably, $\alpha$ is from about 25° to about 35° and most preferably, from about 28° to about 32°. When $\alpha$ is less than about 20°, there is insufficient volume available to contain excess adhesive 66 and squeeze-out is a problem.

When $\alpha$ exceeds about 45°, the length of the sidewall 60 is excessively reduced. When $\alpha$ is 45°, the portion of sidewall 60 removed by the chamfer is equal to the length, L, and could result in the entire sidewall being removed.

In addition to containing squeeze-out, the chamfer reduces the size of burrs along the package edges. Stamping burrs for nonchamfered parts are on the order of 0.051 mm–0.076 mm (0.002–0.003 inch). When the parts are chamfered, the burrs are less than 0.013 mm (0.0005 inch). Smaller burrs simplify the post-stamping process step of deburring the parts prior to anodization or plating. Faster, less aggressive deburring can be used resulting in better coating quality and higher productivity.

The angular portion 70 is formed by stamping or another metal deformation process rather than machining. Deformation processes improve consistency from part to part. The length of the angular portion 70 and the length consistency are important. Length affects the epoxy flow and support of the leads. The consistency improves the trim and form of the leads improving lead coplanarity.

With reference back to FIG. 2, while the central portion 62 and peripheral portion 64 are generally coplanar, they need not be elevationally equivalent. A step 76 separating the two portions increases the volume of the cavity 78 providing more room for the semiconductor device 51 and more separation between the cover component 54 and the loops of the bond wires 80. When the step 76 is present, a second angular region 82 may extend obliquely from the step 76 to the peripheral region 68. The second angular region 82 accommodates excess adhesive 66 which could flow along the inner lead portion 84 and interfere with the bond wires 80. An added benefit of the second angular region 82 is the bond wires 80 may be positioned closer to the sidewalls of the package cavity 78 without contacting the metallic package components and developing an electrical short circuit. As a result, larger semiconductor devices 51 may be housed within a given package size.

The requirements of the second angular region are substantially the same as those of the stamped angular region 70. The effective length is from about 0.13 mm to about 0.51 mm (0.005–0.020 inch) and preferably, from about 0.18 mm to about 0.38 mm (0.007–0.015 inch) and most preferably, from about 0.23 mm to about 0.28 mm (0.009–0.011 inch).

The angle formed by the second angular portion 82 relative to the first major surface 56 as defined by the peripheral portion 64 is from about 20° to about 45° and preferably, from about 25° to about 35°. Most preferably, this angle is from about 28° to about 32°.

The advantages of the electronic package component design of the present invention will become more apparent from the example which follows. The example is illustrative and not intended to limit the scope of the invention.

EXAMPLE

Ninety electronic packages having anodized aluminum base and cover components without a chamfer were adhesively sealed using a thermosetting epoxy and having a leadframe disposed therebetween. The seal profile was 180° C. for 110 minutes. A second group of 90 packages similar to the first group, but having chamfered edges with an angular portion length, L, of 0.25 mm (0.01 inch) and an angle, α, of 30° were sealed according to the same seal profile. The packages were then evaluated for squeeze-out, determining whether there was any squeeze-out and if there was sufficient squeeze-out to interfere with lead forming, identified as a reject and defined as squeeze-out exceeding of 0.076 mm (0.003 inch).

The table illustrates that the chamfer greatly improved squeeze-out resistance of the electronic package.

| PACKAGE TYPE | ANY SQUEEZE-OUT | SQUEEZE-OUT REJECT |
| --- | --- | --- |
| Chamfered parts | 4 | 0 |
| Standard parts | 46 | 3 |

While the invention has been described in reference to leaded packages of single in line, dual in line and quad configurations, the concepts may applied to lead free packages such as pin grid array, ball grid array and leadless chip carriers. A chamfer is formed around the perimeter preventing adhesive squeeze-out which will distort the package footprint. An angular portion formed around the apertures through which terminal pins extend will also compensate for excess adhesive flow.

It is apparent that there has been provided in accordance with this invention, an adhesively sealed electronic package which reduces squeeze-out and which fully satisfies the objects, features and advantages described above. While the invention has been described in connection with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package component, comprising:
   a metal or metal alloy substrate having opposing, generally parallel, first and second major surfaces separated by sidewalls;
   said first major surface having a central portion and a peripheral portion; and
   said peripheral portion having a seal region and a mechanically deformed angular region, said seal region being generally coplanar with said first and second major surfaces, said mechanically deformed angular region extending obliquely from said sidewalls to said seal region and having an effective length of from about 0.13 mm to about 0.51 mm and an angle relative to said first major surface of from about 20° to about 45°.

2. The electronic package of claim 1 wherein said central portion and said peripheral portion are at different elevations separated by a step.

3. The electronic package component of claim 2 wherein a second angular region extends obliquely from said step to said seal region.

4. The electronic package of claim 3 wherein said second angular region has an effective length of from about 0.13 mm to about 0.51 mm and an angle relative to said first major surface of from about 20° to about 45°.

5. The electronic package component of claim 1 wherein said mechanically deformed angular region has a length of from about 0.18 mm to about 0.38 mm.

6. The electronic package component of claim 5 wherein said mechanically deformed angular region has an angle relative to said first said major surface of from about 25° to about 35°.

7. An electronic package for housing one or more semiconductor devices, comprising:
   a base component having opposing, generally parallel, first and second major surfaces separated by sidewalls, said first major surface having a central portion and a peripheral portion, said peripheral portion having a seal region and a mechanically deformed angular region, said seal region being generally coplanar with said first and second major surfaces, said mechanically deformed angular region extending obliquely from said sidewalls to said seal region and having an effective length of from about 0.13 mm to about 0.51 mm and an angle relative to said first major surface of from about 20° to about 45°;
   a cover component having opposing, generally parallel third and fourth major surfaces separated by sidewalls, said third major surface having a central portion and a peripheral portion, said peripheral portion having a seal region and a mechanically deformed angular region, said seal region being generally coplanar with said third and fourth major surfaces, said mechanically deformed angular region extending obliquely from said sidewalls to said seal region and having an effective length of from about 0.13 mm to about 0.51 mm and an angle relative to said third major surface of from about 20° to about 45°;
   a leadframe disposed between said base component and said cover component; and
   an adhesive bonding said leadframe to the seal region of both said base component and the seal region of said cover component.

8. The electronic package of claim 7 wherein said base component and said cover component are selected from the group consisting of plastics, metals, metal alloys, metal composites and metal compounds.

9. The electronic package of claim 8 wherein said base component and said cover component are selected from the group consisting of copper, aluminum and alloys thereof.

10. The electronic package of claim 9 wherein said base component and said cover component are both selected to be an aluminum alloy coated with an anodization layer.

11. The electronic package of claim 8 wherein said central portion and said peripheral portion are at different elevations and separated by a step.

12. The electronic package of claim 11 including a second angular region extending obliquely from said step to said seal region and having an effective length of from about 0.13 mm to about 0.51 mm and an angle relative to either said first major surface or said third major surface of from about 20° to about 45°.

13. The electronic package of claim 12 wherein said mechanically deformed angular region has a length of from about 0.18 mm to about 0.38 mm.

14. The electronic package of claim 13 wherein the angle between said mechanically deformed angular region and said first major surface and said mechanically deformed angular region and said third major surface is from about 25° to about 35°.

15. The electronic package of claim 14 further including one or more semiconductor devices bonded to the central portion of said first major surface.

16. The electronic package of claim 14 wherein a vent hole extends between said third major surface and said fourth major surface.

17. The electronic package of claim 14 including a plurality of fins formed in said fourth major surface.

* * * * *